Figure 5:
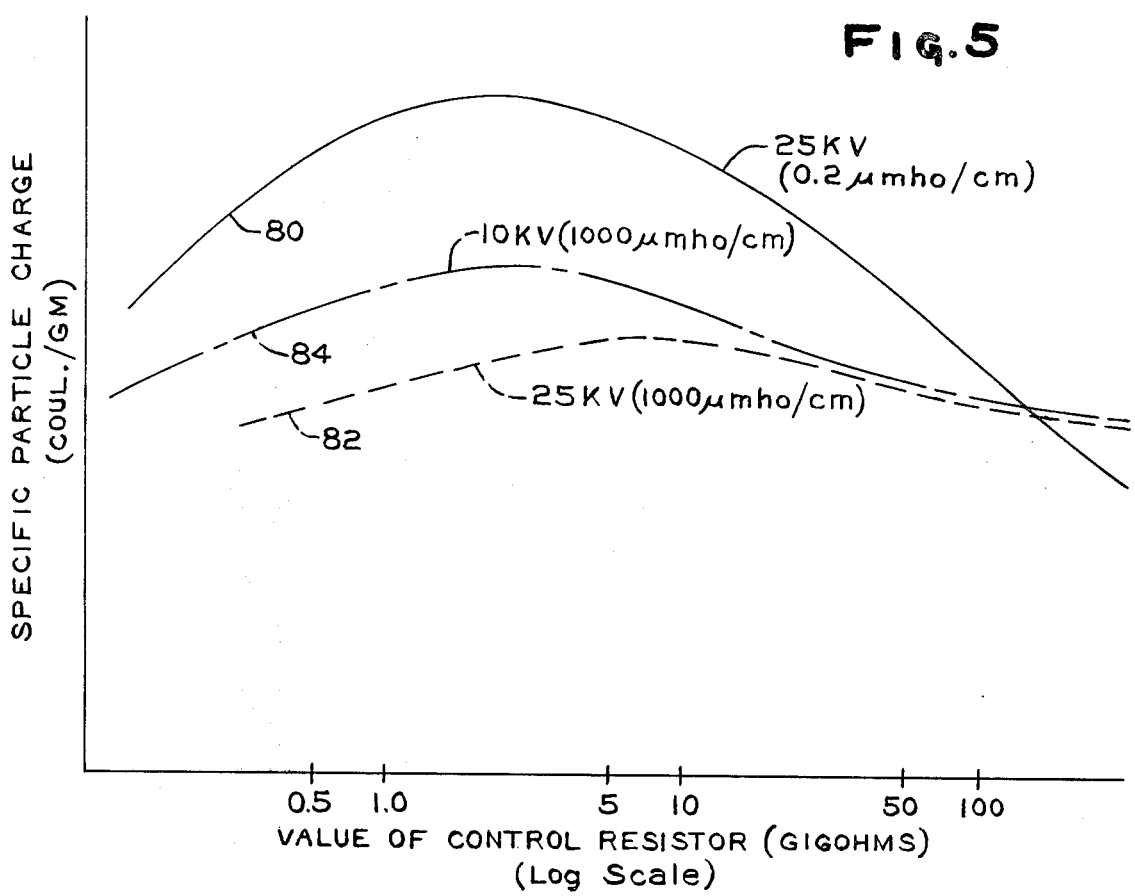

United States Patent [19]

Sickles et al.

[11] 4,073,002

[45] Feb. 7, 1978

[54] SELF-ADJUSTING POWER SUPPLY FOR INDUCTION CHARGING ELECTRODE

[75] Inventors: James E. Sickles, Glenshaw; Richard M. Tepper, Allison Park, both of Pa.

[73] Assignee: PPG Industries, Inc., Pittsburgh, Pa.

[21] Appl. No.: 737,889

[22] Filed: Nov. 2, 1976

[51] Int. Cl.² ............................................. B05B 5/02
[52] U.S. Cl. ........................... 361/227; 239/DIG. 14
[58] Field of Search ............... 361/227; 239/DIG. 14, 239/15, 3

[56] References Cited

U.S. PATENT DOCUMENTS

| | | | |
|---|---|---|---|
| 3,273,015 | 9/1966 | Fischer | 361/227 |
| 3,731,145 | 5/1973 | Senay | 239/DIG. 14 |
| 3,895,262 | 7/1975 | Ribnitz | 361/227 |

*Primary Examiner*—Gerald Goldberg
*Attorney, Agent, or Firm*—J. Timothy Keane

[57] ABSTRACT

A self adjusting power supply for induction charging electrodes used in electrostatic spray coating apparatus is disclosed. A first resistance of high ohmic value is connected in series between a source of high direct current voltage and the induction charging electrode, while a second resistance is connected between the source of voltage and a ground reference point. The first resistance acts as a voltage divider with the spacial impedance which exists between the charging electrodes and ground in the spray nozzle of the spray coating apparatus, and serves to regulate the charging voltage and to compensate for variations in the conductivity of the material being sprayed. If the value of the spacial impedance should decrease for any reason, the increased current flow therethrough produces an increase in the voltage drop across the first resistance, thereby reducing and thus regulating the potential at the charging electrodes and serving to prevent corona and arcing within the spray gun. The ohmic value of the first resistance, which is in the range of 1–50 gigohms, is sufficiently high to prevent any substantial current flow from the charging electrode, thereby reducing the shock hazard of the spray gun, and also to prevent any significant changes in the current flow due to changes in the conductivity of the spray material. The second resistance serves as a bleeder for the charges on the spray gun and the induction charging electrode when the gun is turned off.

9 Claims, 5 Drawing Figures

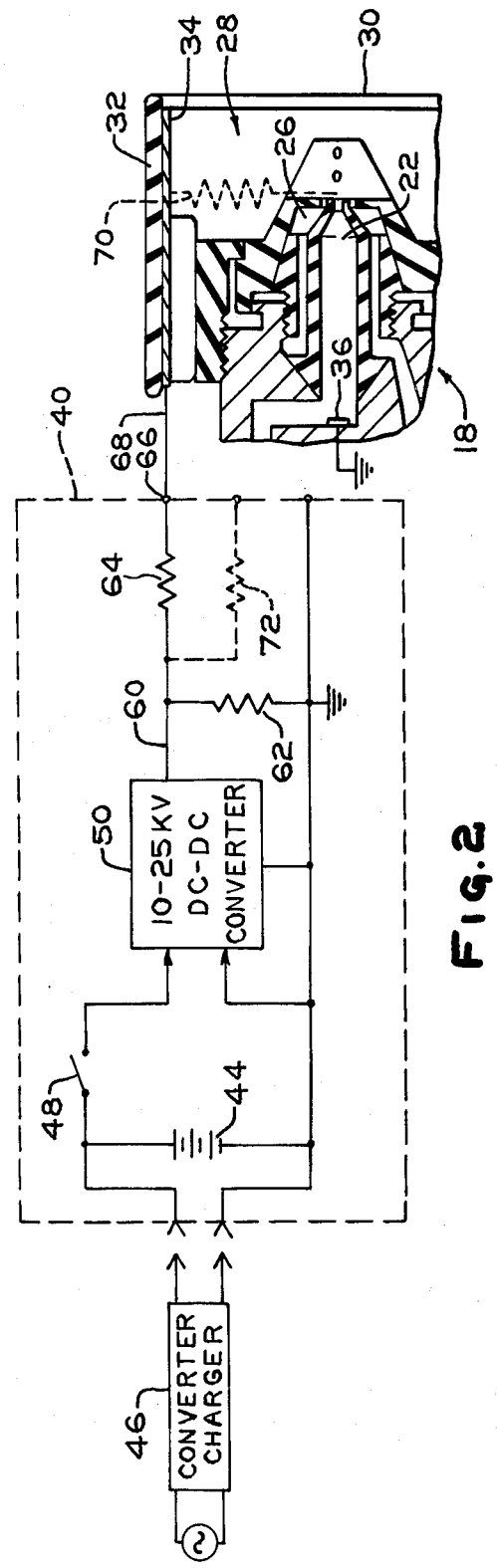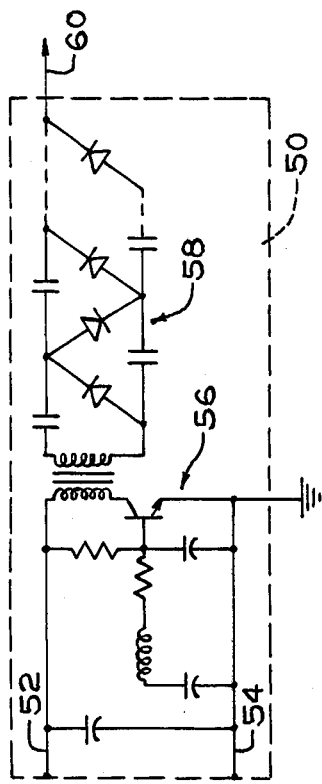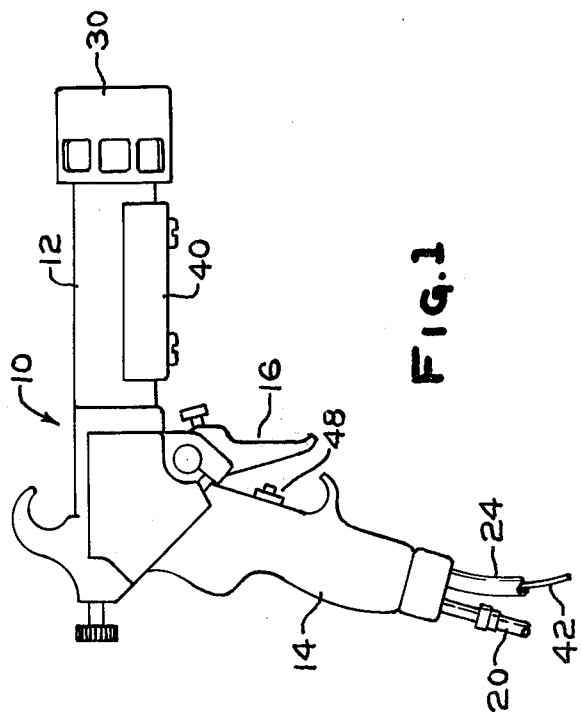

SELF-ADJUSTING POWER SUPPLY FOR INDUCTION CHARGING ELECTRODE

BACKGROUND OF THE INVENTION

The present invention relates, in general, to the art of induction charging of liquid spray particles in electrostatic spray coating apparatus, and more particularly to a self-adjusting power supply for such apparatus.

The principle of providing an electrostatic field for charging atomized liquid particles and utilizing the charged particles for coating a workpiece has been in general use for many years. A great variety of spray gun configurations have been devised for such systems, some of which work reasonably well and some of which are less than satisfactory. Virtually all of these prior electrostatic devices have in common a spray gun to which is mounted a high voltage electrode disposed adjacent the spray discharge point and carrying an electrical potential in the neighborhood of from 50 to 85 kilovolts; in certain instances, the potential may be as high as 150 kilovolts. The potential on this electrode and the resulting electric field creates a corona discharge condition, producing a region rich in ions through which the spray particles pass. Some of these ions become attached to the spray droplets, producing net electric charges on the particles which may then be directed by the electric field extending between the electrode and an electrically grounded workpiece which, therefore, attracts the particles.

The use of very high potentials on such prior devices has been required to insure that the potential gradient between the spray gun and the target to which the spray particles are directed is sufficient to maintain the conditions under which ionization, and thus charging of the particles, can be created and maintained. The high voltages utilized in these systems produce hazardous working conditions, however, for many of the spray coating materials employed in such systems are flammable, and in some cases highly so, producing the likelihood of a fire or explosion if an arc or spark of sufficient intensity should be produced by moving the spray gun and its corona discharge electrode too close to a grounded object. To insure that no sparking or other discharges occur in such systems it has been found necessary to impose strict limits on the spacing of charging electrodes from the workpiece to be coated, resulting in a decrease in the efficiency of the operation since the average potential gradient between the electrode and the target is correspondingly limited.

In cases where the material being sprayed is not of a nature to create the danger of fire or explosion, problems still exist since the high voltage used in such systems can result in severe electrical shocks to operating personnel. Even though the current flow is below a level which might cause permanent injury or death, nevertheless the shocks produced by such devices are unpleasant, and often can have serious consequences. The high voltages may also create an excessive current flow in the form of ions which may travel to nearby objects, resulting in an undesired charge build up on objects that are not adequately grounded, including the spray gun itself on occasion. Such a build up on the spray gun can result in clogging and premature shut down for cleaning.

The creation of ionized particles in a corona device, and the subsequent motion of the particles from the spray gun to a target such as a grounded workpiece, produces a substantial current flow and this current, together with the very high potentials required for the production of corona effects, imposes a requirement for a relatively large capacity power supply. Conventional high voltage power supplies having sufficient capacity for such applications are not only bulky and heavy, but are quite expensive. Further, such power supplies normally are separate units connected to the spray gun by way of a high voltage cable which must be heavily insulated to withstand the high output voltage. Such cables are relatively inflexible and thus are unwieldy and difficult to use, and the combination of a bulky, heavy power supply with heavy, inflexible interconnecting cables substantially restricts the usefulness of the spray gun because of the difficulty of handling and moving it.

In each of U.S. application Ser. No. 634,386 of James E. Sickles, filed Nov. 24, 1975, and U.S. application Ser. No. 548,958, also of James E. Sickles, filed Feb. 11, 1975, there is disclosed a spray coating apparatus which, through the induction charging of spray particles, avoids the problems inherent in the corona discharge apparatus discussed above. Induction charging is accomplished in the devices disclosed in these applications by surrounding the liquid discharged from a spray nozzle with a static electric field which has an average potential gradient in the range of about 10 to 20 kilovolts per inch. In the preferred form, one or more electrodes are spaced about the liquid discharge nozzle, a suitable potential is applied to the electrodes, and the nozzle is held at ground potential. The impedance of the space between the nozzle and the electrodes to which the potential is applied is sufficient to prevent an electrical discharge either in the form of an arc or a corona. The static electric field induces on liquid particles produced within the field an electrical charge having a polarity which is opposite to that of the applied voltage, with the particles carrying quantities of the charge. Because the charges are induced in the particles by a static field at reduced electrode potential without a corona discharge, almost no current flows in such devices, thus allowing a substantial reduction in the current and voltage requirements for the power supply. The resulting charged particles may then be directed at, for example, an electrically grounded workpiece, the particles striking the workpiece to provide a coating of the liquid thereon.

Such induction charging techniques have been found to be particularly useful in spray systems utilizing electrically conductive liquids such as water base paints, since the liquid can be electrically grounded. This eliminates one of the hazards of corona discharge devices which utilize a high voltage source in contact with the liquid being sprayed. In most corona devices, at least a portion of the liquid is at approximately the same high voltage as the electrode, requiring in the case where a conductive liquid is used, that the liquid itself and its supply source be electrically isolated to prevent excessive current flow to ground and consequent shorting of the power supply, and to insure the safety of the operator. The lower voltages and current levels at the electrode, together with the grounding of the liquid supply, in an induction type of system eliminates the problems inherent in high voltage isolated systems, thus reducing the danger of operator injury, providing increased convenience and flexibility in use, reducing the danger of arcing if the spray gun is moved too close to a grounded object, and reducing the intensity of any such arc and the danger of fire if such arcing should occur.

The aforementioned patent application disclose both apparatus and methods for producing inductively charged spray particles utilizing a DC voltage of between about 7 and 25 kilovolts. The devices disclosed therein have been operated successfully to provide greatly improved electrostatic spray coating operations, and from this standpoint have been more than satisfactory. Further, the power requirements imposed by the lower voltage and current ratings of an induction spray operation have led to the development of smaller and less expensive systems and recently to the development of portable power supplies which may be attached to the spray gun itself. This has resulted in a spray gun apparatus which is easier to handle, which is less expensive, which is easily portable, and which has improved safety characteristics. Such power supplies are described in greater detail in copending applications Ser. No. 739,171 filed Nov. 5, 1976, of Charles D. Hendricks, entitled "Detachable Cylindrical Power Supply for Induction Type Electrostatic Spray Gun", and Ser. No. 739,170, filed Nov. 5, 1976, of James E. Sickles, entitled "Detachable Power Supply for Induction Type Electrostatic Spray Gun", both assigned to the assignee of the present application.

Although the relatively low voltages used in induction charging spray guns reduced or eliminated many of the problems that had been inherent in corona discharge spray guns, some of the problems remained. For example, the potential carried by the charging electrodes, although greatly reduced, was still sufficient to produce a substantial shock if the operator should accidentally come in contact with it, and the danger of arcing or sparking still existed if the electrode should be moved too close to a target or other grounded object, if a spray build up should occur within the gun that would reduce the distance between the charging electrode and the grounded liquid supply nozzles, or if the conductivity of the liquid being sprayed should change. Attempts were made to control the problem of shock and arcing through the use of a series resistance connected between the power supply and the electrode in the manner of the series resistances used in corona discharge devices. As described in patents such as U.S. Pat. No. 3,048,498 to Juvinall et al., U.S. Pat. No. 2,926,106 to Gauthier, and U.S. Pat. No. 3,169,498 to Juvinall et al., such series resistors typically have been used to limit the current flow from the high voltage source in the event of a short circuit condition at the corona discharge electrode, thereby preventing the dangerous current levels which could be injurious to personnel or which could produce intense sparking that could lead to explosions and fire. Such a limiting resistor is also disclosed in U.S. Pat. No. 3,698,635 of James E. Sickles, this patent teaching its use in an induction charging device for the same purpose.

Such current limiting resistors, as taught in the prior art, are selected at an ohmic value that is sufficiently high to provide the required safety features, but which is sufficiently low to insure that the corona discharge effect is not disturbed, and that a sufficiently high potential gradient is maintained between the spray gun apparatus and the target to insure proper transfer of the spray particles. Thus, as set forth in U.S. Pat. No. 3,048,498 to Juvinall et al., the value of such a resistance should be on the order of 10 megohms per kilovolt, or slightly more, with a value of more than about 100 megohms per kilovolt being undesirable as adversely affecting the operation of the device. As stated in that patent, this relationship obtains throughout all voltage ranges used for electrostatic spray coating. Other patents relating to corona effect devices teach the provision of similar values of resistance, or values of the same order of magnitude, to accomplish the same current limiting purposes, and these teachings were followed in U.S. Pat. No. 3,698,635 to Sickles, which uses a current limiting resistor having an ohmic value of about 125 to 140 megohms with an electrode voltage of about 10 kv.

In spite of these numerous teachings in the prior art concerning the use of a series resistor for current limiting purposes, however, some difficulties have still been encountered in the operation of induction charging spray guns. The principal problems have occurred in maintaining the optimum potential gradient between the charging electrode and the liquid spray, which typically is at ground potential, which is required for maximum droplet charging and deposition of spray particles. Although it is possible to establish the desired potential for the spray gun at the start of a spray operation, it has been found that the collection of even a few liquid particles on the various parts of the gun, including the barrel and supports for the electrode as well as on the nozzle and the electrode itself, can result in a reduction of the effective spacial impedance between the electrode and the liquid spray. This reduction in the spacial impedance increases the voltage gradient across this space, producing an increased current flow, and varying the charge induced on the spray particles. A continued collection of particles can lead to a large voltage gradient, producing an excessive current flow which can result in corona or arcing within the charging zone of the spray gun or between the gun and a target, thereby significantly reducing droplet charge efficiency. When such arcing occurs, the current limiting resistor of the prior art may function to limit the arc current, but the changes in the potential gradient prior to actual arcing are not sufficiently controlled by the current limiting resistor of the prior art to prevent adverse effects on the deposition efficiency of the coating, nor do such resistors prevent undue drains on the power supply. If highly conductive liquids are being sprayed, the foregoing problems are aggravated, and the build-up of material on the gun can cause substantial leakage of current and reduction in the effectiveness of the spray apparatus.

Another problem encountered in the use of prior electrostatic spray guns is the fact that any steps taken to prevent the current leakage described above in the operation of electrostatic spray guns result in a device which has a high capacity for the storage of electrostatic charges even after it has been turned off and the spray operation has stopped, with the result that such spray guns can retain a very high potential. This capacitive effect can produce unpleasant shocks and can create sparks which can do considerable damage if great care is not taken in the handling of the devices. The provision of current limiting resistors in the prior art devices, as discussed above, tends to increase the ability of the spray gun to retain such charges, and in this regard such resistors have been a hinderance rather than a help.

Because of the difficulties which significant variations in the potential gradient from the nominal value can produce in prior systems, it has been found necessary to provide a potentiometer or similar control means on the power supply that permits manual adjustment of the voltage level to accommodate the changing conditions during the operation of the gun. Such a control means requires continual adjustment by the operator and requires acquisition of a considerable degree of skill if a uniform coating is to be obtained. If the operator is not alert to changing conditions, such as variations in the humidity in the air, changes in the conductivity of the liquid being sprayed, the build-up of particles in the spray gun and the like, changes in the potential gradient within the gun or between the gun and the target will lower the deposition efficiency of the coating. When the change is discovered by the operator, it is then necessary to stop the spraying operation and adjust the power supply for a return to optimum conditions, before continuing. Such an arrangement has been found to be not only inconvenient, but unsatisfactory in practice.

BRIEF SUMMARY OF THE INVENTION

It is therefore an object of the present invention to provide an improved power supply for electrostatic spray guns, and in particular for spray guns utilizing inductive charging, whereby the difficulties encountered in the operation of prior spray apparatus are avoided.

It is further object of the invention to provide means for maintaining optimum conditions for inductive charging during fluctuations in the potential gradient within an inductive charging spray gun, which fluctuations occur as a result of build-up of liquid particles within the gun, changes in the humidity of the ambient air or of the pressurized supply of air, variations in the liquid being sprayed, the rate at which the liquid is being discharged, and the like.

It is another object of the invention to provide a control means connected between a high voltage source for an electrostatic induction charging spray gun and an induction charging electrode, which means serves to regulate the voltage output to prevent overvoltage conditions at the induction charging electrode.

It is a further object of the invention to provide a control means connected between the high voltage source for an electrostatic spray gun and the high voltage electrode which induces charges on the sprayed material, which means will serve to not only limit the current flow to the electrode, but will also prevent the retention of high charges on the gun after it is turned off, while at the same time automatically regulating the voltage gradient within the charging chamber of the spray gun to achieve optimum spray stream charging by compensating for changes in the material being sprayed and for variations in the spacial impedance within the charging zone.

It is another object of the invention to provide a control means for an electrostatic spray gun which serves to limit the current flow to the spray gun electrodes, to increase the degree of safety of the gun, to compensate automatically for changes in the conductivity of the liquid being sprayed, and to automatically regulate the voltage gradient within the charging zone of the induction spray device to thereby provide an induction spraying system which is safer to use than prior devices, provides automatic regulation and compensation for variations in the characteristics of the material being sprayed and in the conditions within the charging zone, without the need for external manual controls.

Briefly, the various advantages of the present invention are obtained through the provision, in an induction charging spray gun having an induction electrode, of an automatic control means which is comprised of a voltage divider network which cooperates with the spacial impedance of the spray gun itself to regulate the voltage applied to the charging electrode. The voltage divider network is connected as a part of the power supply in a preferred embodiment of the invention, and includes a series control resistance and a shunt control resistance connected to the output of the high voltage source. The series resistance is of a very high ohmic value, at least an order of magnitude greater than any resistance value suggested by the prior art. It has been found that, contrary to the teachings of the prior art, this high resistance value does not reduce the effectiveness of the spray particle charging, but instead serves not only to provide an extra margin of safety in the system of the present invention by limiting the current to a greater extent than is possible in a corona discharge device, which requires a relatively large current flow for operativeness, but also serves to regulate the voltage applied to the spray gun so that the potential at the induction electrode remains at an optimum value for induction charging, thereby enhancing the operation. The shunt resistance, on the other hand, serves as a bleeder for the electrode and other elements of the system normally at high voltage, whereby the charge remaining thereon when the spray gun is shut down will be quickly dissipated to prevent shocks or sparking.

The two resistances cooperate with the impedance which exists in the charging chamber of the spray gun. This impedance principally includes that which exists between the induction electrode and the liquid being sprayed, but also inclues the impedance which exists between the induction electrode and external grounded objects such as the workpiece to be coated. Because the distances to such external objects are relatively so large, however, the impedance to ground is not a practically significant factor and normally may be ignored. When the spray gun is moved very close to a workpiece or other external object during operation, on the other hand, the consequent reduction in the impedance existing between the charging electrode and such an object can become significant, and in this event enters into the operation of the power supply control. For convenience of reference, the terms "spacial resistance" or "spacial impedance" will be used herein to refer to the impedance presented to current flow from the induction charging electrode, whether that flow be to the liquid spray nozzle, the liquid itself, or to an external electrical ground point. It should also be understood that by the term "electrical ground" is meant an electrical reference voltage which normally is considered to be at ground potential, but which may, if desired, be at some other selected potential.

When the spacial resistance of the spray gun decreases because of the build up of sprayed material, changes in humidity, changes in conductivity of the fluid being sprayed, movement of the gun, or the like, the current flow from the electrode tends to increase. This results in an increased draw of current from the power supply which, in turn, produces an increased voltage drop across the series control resistance which effectively reduces the voltage at the charging electrode. The reduced potential at the electrode reduces the current flow within the charging chamber of the spray gun, automatically restoring the balance of the system and maintaining an optimum potential gradient in the charging chamber.

In order to obtain this automatic control of the potential gradient within the charging chamber of an induction spray gun, it has been found that the series control resistance used in the control voltage divider must have a value considerably in excess of the current limiting resistors of the prior art. Although the prior art indicates a maximum value of about 100 megohms per kilovolt for a current limiting resistor to provide the required balance between the need for a substantial current flow in a corona discharge device for operability, and the need to limit the current to a safe value, it has now been discovered that, contrary to the teachings of the prior art, a series resistance of the order of magnitude of 1000 megohms per kilovolt produces highly desirable and unexpectedly favorable results. The conflict between the necessity of a low resistance for operability and a high resistance for safety is eliminated in accordance with the present invention, the very high resistance value of the invention providing increased safety and at the same time improved operation, thereby producing an indication charging apparatus that is safer, less expensive, easier to handle and which is self-adjusting to various operational conditions to provide an optimum degree of operation over an extended period of time.

Cooperation between the series resistor and the shunt resistor also provides voltage regulation of the power supply output so that over-voltage conditions are not created at the induction charging electrode. The shunt resistor acts in effect as a constant load across the power supply outputs such that the voltage across the shunt resistor and the current through it remain substantially constant. Any tendency for the voltage to increase, as when the spacial impedance of the induction charging electrode increases, is moderated by the presence of the constant load across the output.

The self-adjusting features permit elimination of the manually controlled voltage selector of the prior art, thereby removing the need for an operator so spend time trying to adjust the spray gun to varying conditions, and eliminating the poor quality of coating which occurs when prior devices become misadjusted. The automatic operation of the present invention also increases the time in operation of a spray gun for it reduces the cleaning frequency by keeping the charging electrodes at optimum voltage. It has been found that too high a voltage can cause collection of charged particles on the electrodes, and by keeping these electrodes at optimum voltage levels, the attraction of particles is kept to a minimum which is consistent with peak charging performance. Thus, the present invention automatically provides the desired optimum operation, provides an improved spray characteristic, eliminates adjustment and handling problems, and provides a less expensive yet significantly improved electrostatic spray gun apparatus.

BRIEF DESCRIPTION OF THE DRAWINGS

The foregoing and additional objects, features, and advantages of the present invention will be apparent to those of skill in the art from a consideration of the following detailed description of the invention, taken in conjunction with the accompanying drawings, in which:

FIG. 1 illustrates an electrostatic spray gun of the induction charging type in which the control means of the present invention may be utilized;

FIG. 2 is a diagrammatic illustration of the electrical circuitry of the present invention;

FIG. 3 is a schematic diagram of a typical DC to DC high voltage converter suitable for use in the system of FIG. 2;

FIG. 4 is a diagrammatic illustration of the variation in specific particle charging, showing the effect of variation in the control resistance for various electrostatic spray guns; and FIG. 5 is a diagrammatic illustration of the effect of varying controlled resistances on an induction spray gun for varying operational characteristics.

DESCRIPTION OF A PREFERRED EMBODIMENT

Turning now to a more detailed consideration of the present invention, there is illustrated in FIG. 1 a typical electrostatic spray gun 10 which may be of conventional design, having a barrel portion 12, a handle 14, and a trigger 16 which regulates the flow of spray material and the application of the charging potential. A suitable spray nozzle 18 is illustrated in partial section in FIG. 2, the construction of such nozzles being described in greater detail in the aforementioned application Ser. No. 548,958 and Ser. No. 634,386. A liquid to be sprayed is supplied from a source (not shown) under pressure by way of liquid supply line 20 through the handle and barrel portions of the spray gun for delivery to the liquid port 22 of nozzle 28. Similarly, air is supplied from a suitable pressurized source (not shown) by way of air supply line 24 through the spray gun to the air discharge port 26 of nozzle 18. The pressurized air and liquid are discharged from the nozzle under the control of trigger 16, the liquid being discharged in the form of minute spray particles into an induction charging chamber 28 formed at the nozzle by a suitable induction charging device 30. As is known, the charging device preferably surrounds the nozzle, and may be constructed as a part of the spray gun 10, or may be an adaptor secured to the end of a conventional corona type spray gun modified for induction charging.

For purposes of illustration, the induction charging device 30 is shown as comprising a generally cylindrical dielectric tube 32 having laminated or otherwise formed on the inside surface thereof a conductive film 34 forming an electrode to which an electric potential may be applied. The electrode 34 may be generally tubular in shape and laminated to the interior surface of the dielectric tube, generally in the manner illustrated in application Ser. No. 634,386, or may take other forms such as the plural electrodes illustrated in Ser. No. 548,958. In either event, the charging device is positioned with respect to the spray nozzle 18 so as to produce a charging zone 28 which surrounds the discharge ports of the nozzle. Upon application of a potential to the electrode 34, an electrostatic field is provided within the charging zone and in the path of the spray particles being discharged from the spray nozzle. The electric potential is applied between electrode 34 and a suitable ground point which may take several forms, depending upon the conductivity of the liquid being sprayed, the internal construction or geometry of the spray device, the length of the supply hose leading from the liquid supply to the spray gun, and other considerations. For example, a grounding head 36 may be located within the liquid passageway and connected to a suitable ground point, or the ground reference for the field may be the liquid itself, connected to ground through the liquid supply source.

The high potential required for operation of the induction charging device is provided by a suitable power supply 40 illustrated in partial schematic form in FIG. 2. The power supply 40 may take several forms, but typically because of the low current requirements of the induction charging system, it may be a relatively small and inexpensive electronic source which may be operated from a rechargeable battery pack. In one form of the invention, the power supply and battery pack may be carried on the person of the operator to provide a highly portable spray gun system which may be easily manipulated and which overcomes the considerable difficulties encountered with the bulky and heavy power supplies required for conventional corona discharge systems. In a preferred form of the invention, the power supply 40 is secured to the barrel of the spray gun itself. The battery pack used with the battery supply may in such a case be a separate unit carried on the person of the operator, and connected to the power supply by way of electrical lead 42, or if the battery is incorporated in the power supply, the lead 42 may be used to provide connections for a suitable charger for the battery. In either event, only a low voltage supply is connected to the gun, thereby eliminating the inflexible and hard to handle high voltage cables of prior electrostatic systems.

As illustrated in FIG. 2, the power supply includes a rechargeable battery pack 44 to which may be connected a suitable converter-charger unit 46 which receives alternating current from a suitable source and converts it to a direct current of suitable low level, such as 11 volts.

The battery is connected by way of a suitable on-off switch 48, which preferably is operated in conjunction with the spray trigger 16 in such a way as to insure that there is a flow of air before the induction charging potential is applied to electrode 34, to the input of a suitable DC to DC converter 50. This converter, which is shown in greater detail in FIG. 3, receives the low level DC voltage from the battery 44, or from the converter-charger 46, and converts it to DC of between about 10 and 25 kilovolts, the exact voltage produced by the converter 50 depending upon the requirements of the spray gun design. A suitable DC to DC converter for use in the power supply 40 is illustrated in schematic form in FIG. 3. As illustrated therein the low level DC voltage is applied at the input terminals 52 and 54 to drive an oscillator 56. The output of the oscillator is transformer-coupled to a conventional voltage multiplier network 58. The turns ratio of the transformer and the number of stages provided in the multiplier are selected in known manner to produce at the output terminal 60 of the converter a voltage of the desired value.

In accordance with the present invention, the high voltage appearing on terminal 60 of the high voltage source 50 is applied across a shunt control resistance, shown as resistor 62, which is connected between a terminal 60 and ground, and is applied through a series control resistance, shown as resistor 64, to the output terminal 66 of the power supply. This terminal is then connected by way of a suitable high voltage lead 68 to the induction electrode 34. Since the high voltage lead 68 has a certain amount of capacitance and thus is capable of storing high voltage even after the spray gun is turned off, it is desirable that this lead be as short as possible, and thus it is preferred that the power supply 40 be mounted on the spray gun or close to it. The potential appearing on electrode 34 creates an electrostatic field between the surface of the electrode and the electrically grounded liquid being discharged from the liquid spray port 22.

A spacial impedance, represented by spacial resistor 70 shown in phantom in FIG. 2, exists between the electrode 34 and the liquid discharge port 22, and it is this spacial impedance which prevents the occurrence of a high voltage arc between the two. The value of resistance 70 depends on numerous factors, and varies in accordance with the operating conditions of the spray gun. Thus, for example, the value of resistance 70 will vary with the humidity of the ambient atmosphere, with the distance between the electrode and the discharge port, with the conductivity with the liquid being discharged, the rate at which the liquid is discharged, and the like. This resistance is also affected by the proximity of the electrode to external ground points such as the workpiece being sprayed, and further is affected over the course of operation of the device by the build-up of conductive or charged liquid particles on the inner or outer surfaces of the induction charging device 30, on the surface of the nozzle 18, on the surface of barrel 12 of the spray gun, and the like.

As has been set forth in the aforesaid copending applications Ser. No. 548,958 and Ser. No. 634,386, the effective application of a charge to the spray particles being discharged from port 22 depends to a greater extent upon the voltage gradient being maintained within the charging chamber, that is, upon the voltage per unit distance between the electrode and the grounded liquid, than upon the absolute value of the voltage applied to electrode 34. This being the case, it will be understood that when a variation in the spacial resistance 70 occurs, resulting in a corresponding variation in the potential gradient existing within the charging chamber, such a variation frequently will have a deleterious effect upon the application of charges to the spray particles.

The control resistors 62 and 64 within the power supply 40 form with the spacial resistance 70 a voltage divider which serves to regulate the value of the voltage appearing at terminal 66 of the power supply and this, it has been found, serves to provide an automatic regulation of the potential applied to electrode 34, and thus of the voltage gradient within the charging zone. This regulation occurs because of the fact that a reduction in the spacial impedance tends to increase the current flow to the charging electrode. However, any increase in current results in a corresponding increase in the voltage drop across the control resistor 64, thereby reducing the volage applied to electrode 34 and maintaining the voltage gradient in the charging zone at a value for optimum particle charging. In order to provide this automatic regulation, however, the ohmic value of control resistor 64 must be far in excesss of the value of any resistor previously used in electrostatic spray gun systems. Thus, the ohmic value of resistor 64 must be of the order of magnitude of about 1000 megohms per kilovolt applied to the electrode 34; thus, where 10 kilovolts are applied to electrode 34, the value of resistor 64 must be approximately 10,000 megohms or 10 gigohms.

The optimum resistance for resistor 64 has been found to be between 1 and 50 gigohms. This high value not only automatically provides an optimum potential at the electrode for maximum particle charging and deposition efficiency, but also limits the maximum possible current level to a safe value. Thus, even if the operator touches the electrodes and short circuits the charging device, the maximum current level would be 2 microamps if resistor 64 has a value of 10 gigohms and the voltage appearing on terminal 60 is 20 kv. Such a current level produces virtually no sensation to the operator and further virtually eliminates the possibility of sparking during operation of the spray gun.

Automatic voltage regulation is provided by cooperation of series control resistance 64 with shunt 62. During periods of low current drain, as when voltage is applied to the electrodes without simultaneous discharge of coating material from the spray nozzle, the voltage at the power supply output can increase to undesirable levels in the absence of a shunt or bleed resistor as a constant load across the output. Since the current and voltage characteristics of the shunt resistor remain substantially constant during operation of the gun, variations in the voltage imposed at the induction charging electrode effect relatively less change in the absolute load at the power supply output. Where the series resistance is large in comparison to the load resistance, the variations in the spacial impedance which produces changes in voltages at series resistor 64 are rendered relatively small. In practice, it has been found that the voltage regulation function can be achieved with a series control resistor 64 and a shunt resistor 62 of approximately equal ohmic value, although better regulation is provided where series resistor 64 is on the order of ten times the ohmic value of shunt resistor 62.

Resistor 62 also provides a leakage path to ground for any charge that might accumulate on the induction electrode 34, in the high voltage section of the power supply, in the dielectric portions of the spray gun structure, and the like during operation of the spray gun. This leakage path drains the accumulated charges to ground when the gun is turned off, so that no spark will be formed if the spray gun should be brought close to a ground point after it has been turned off. It has been found that resistor 62 should have an ohmic value approximately equal to that of the series control resistor 64, i.e., about 10 gigohms, to provide a leakage current of approximately 1 to 2 microamps for a 10 to 20 kv supply. It will be noted that a lower value of the shunt resistance will produce a faster drainage time for the accumulated charges on the spray gun, and thus a value somewhat less than 10 gigohms may be desirable. However, reduction of this resistance value is limited by the capacity of the power supply to provide this current drain during operation of the system. This current level preferably will drain the charge off of the high voltage supply and from the spray gun structure within a few seconds after the low voltage applied to converter 50 has been switched off by opening switch 48. This drainage feature provides the further advantage of allowing the system to be turned off by means of a low voltage switch rather than requiring that a high voltage switch be provided at the output of the converter.

Illustrated in phantom at 72 is a second control resistor which may be provided in the power supply 40 if an additional spray gun is to be operated from the same power supply. The low current requirements of the present invention permits several induction charging units to be operated from a single power supply, and thus additional output terminals may be provided as desired.

Figure 4:
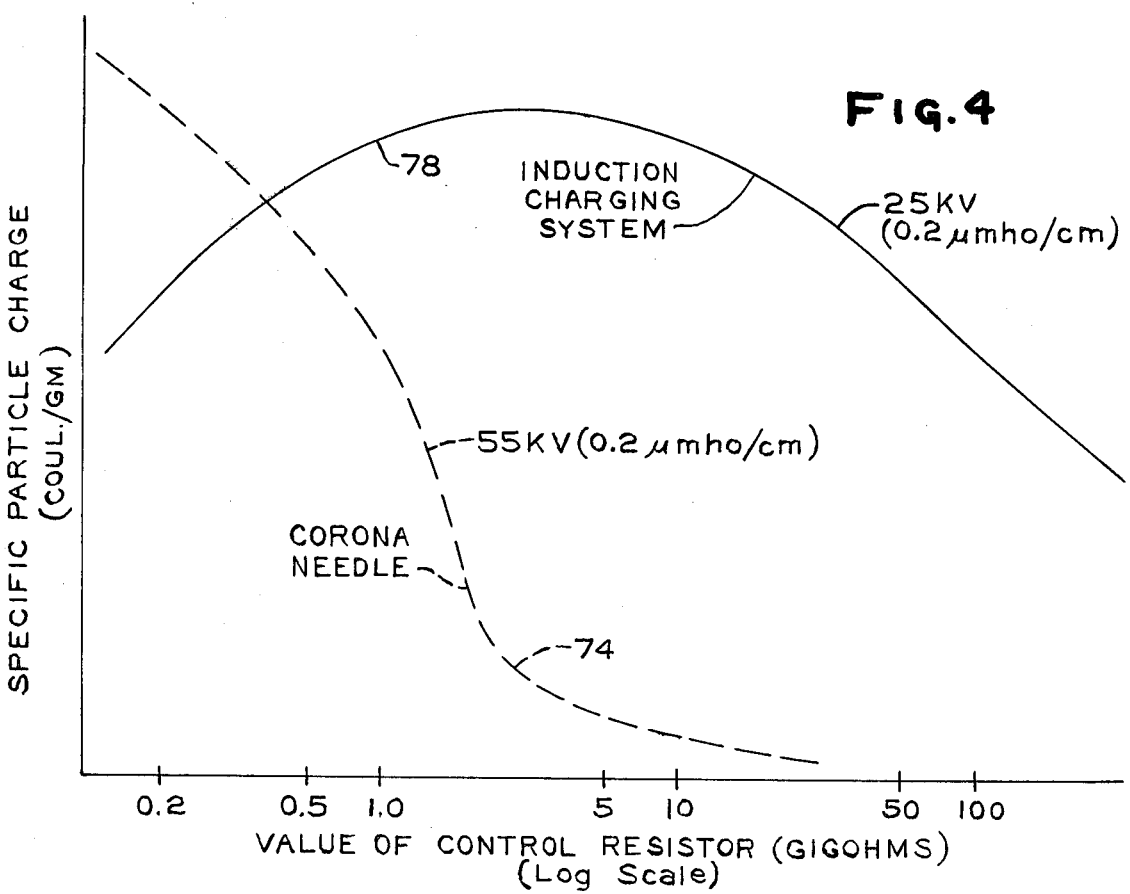

The manner in which the control resistance 64 operates to provide automatic regulation of the potential gradient in an induction charging system is illustrated in FIG. 4, where the effect of this resistance on the specific charge on spray particles is illustrated. The graph of FIG. 4 was plotted from actual measurements taken in a spray system wherein a corona type spray gun with a grounded fluid supply (curve 74) operating with an applied voltage of 55 kv, and an induction spray gun (curve 78), operating at an applied voltage of 25 kv, were used to spray a target under identical spraying conditions and coating material parameters. A commercial plastic spray nozzle was used with each gun, with a standard fluid having a conductivity of 0.2 $\mu$mho/cm being sprayed toward a target positioned 12 inches away from the spray nozzle. A ½ inch diameter hole in the center of the target allowed part of the spray to pass through the opening to a collector, and the current from that collector to electrical ground was measured with an electrometer to obtain the charge collection rate. The amount of liquid collected in a measured time permitted calculation of the specific charge on the spray droplets. This measurement of the average charge to mass ratio of the spray stream reaching the target gives a good quantitative comparison of the droplet charging characteristics of the various electrostatic charging methods, since this testing discriminates against the collection of free ions, which, because of their higher mobility, tend to collect on the target.

As illustrated by curve 74 in FIG. 4, conventional electrostatic spray systems give a high specific charge at low values of the control resistor 64. However, at such low values of resistance substantial currents can flow, causing the safety hazards discussed above. As the value of the control resistance 64 is increased to one gigohm ($10^9$ ohms) the specific charge on the spray particles produced by the corona needle spray gun falls off drastically, and at 5 gigohms approaches inoperativeness.

From curve 74 it is clear that the advantages of very high, gigohm-range control resistances cannot be obtained with conventional corona-type electrostatic spray devices, and thus the safety and the automatic regulation features described with respect to the present invention have not previously been available. However, as illustrated by curve 78, the specific particle charge produced by an induction charging device actually increases as the control resistance 64 is increased into the gigohm range, reaching peak efficiency at a value of about 5 gigohms. The peak specific charge attained is approximately equal to the charge attained by the conventional devices, but with less than one-half the applied voltage, with a greater degree of safety, and with automatic regulation of the potential gradient in the charging zone of the spray device.

It will be noted from curve 78 that a continued increase of the control resistance above the 5 gigohm level does not produce the sharp drop in efficiency exhibited with conventional devices; to the contrary, the efficiency remains relatively high as the resistance increases above 10 gigohms, thus retaining substantial efficiency at the 50–100 gigohm levels.

The variation of the specific charge applied to spray particles with changes in the conductivity of the fluid itself is illustrated in FIG. 5, a comparision of the curves showing that for very high control-resistance values even substantial changes in the conductivity of the fluid will not produce a significant change in the charge applied to the particles.

Curve 80 illustrates the changes in specific particle charge for a liquid having a conductivity of 0.2 μmho/cm when that liquid is sprayed from an induction charging spray gun to which a voltage of 25 kv is applied through a control resistor 64. As shown, peak charging efficiency occurs at about 5 gigohms, in accordance with the results illustrated in FIG. 4. Curve 82 shows that if a highly conductive liquid, on the order of 1000 μmho/cm is used, the charging efficiency drops off somewhat, but remains relatively constant over a wide range of values for resistance 64. At very high resistance values, the charging efficiency equals or exceeds that of the low conductivity liquid.

Curve 84 illustrates the effects of a reduced voltage applied to a liquid of high conductivity. Again, the efficiency is seen to drop below that for a low conductivity material, but it remains relatively constant, equalling or exceeding the efficiency of the device of curve 80 at high resistance values. Thus it will be seen from FIG. 5 that the use of a very high resistance value, in the gigohm range, in an induction charging device provides automatic compensation for changes in the conductivity of the liquid being sprayed, such changes in conductivity having little if any significant effect on the charging efficiency of the device. Further, the level of the applied voltage does not significantly affect the performance of the device, and accordingly the present system has the advantage of permitting significant changes in the conductivity of the liquid being sprayed without the need for changing the value of resistor 64 or the applied voltage. Finally, it may also be observed from curves 82 and 84 the ability of the present invention to regulate the potential at the electrode to provide optimum specific charging of the spray stream particles notwithstanding wide variations in the power supply output voltage. The present system provides automatic compensation for such changes.

The invention disclosed herein has wide applicability to spraying devices utilizing electrostatic charging of coating materials by the induction method, such as those devices disclosed in applications Ser. No. 548,958, filed Feb. 11, 1975 and Ser. No. 634,386, filed Nov. 24, 1975 of James E. Sickles and in application Ser. No. 718,633 filed Aug. 30, 1976 of James E. Sickles et al.

Thus there has been disclosed a new and highly effective apparatus for controlling the potential applied to an inductive charging electrode and for regulating that potential to maintain the voltage gradient within the induction charging device required for optimum charging of the spray particles. Although the invention has been disclosed in terms of a specific embodiment thereof, it will be understood that variations may be made without departing from the true spirit and scope of the invention as defined in the following claims.

What is claimed is:

1. In an electrostatic induction spray system including a spray nozzle, electrode means adjacent the nozzle and spaced therefrom to define an induction charging zone, and a power supply having a voltage source for supplying a DC voltage to said electrode to produce within said charging zone an electrostatic field which surrounds the discharge ports of said nozzle, the improvement comprising:

control impedance means connected between said voltage source and said electrode means, said control impedance means including a control resistance in effective series circuit relationship with the internal spacial impedance across said charging zone to regulate the voltage applied to said electrode means.

2. The system of claim 1, wherein the ohmic value of said control resistance is sufficient to produce within said charging zone an average voltage gradient of less than about 25 kv/in.

3. The system of claim 1, wherein the ohmic value of said control resistance is between about 1000 megohms and 50,000 megohms.

4. The system of claim 1, wherein said control impedance further includes a shunt resistance connected between said voltage source and ground potential, said shunt resistance having an ohmic value approximately equal to or less than value of said control resistance.

5. The system of claim 4, wherein said control resistance and said shunt resistance each have an ohmic value of between about 1000 megohms and 50,000 megohms.

6. The system of claim 4, wherein the ohmic values of said control and shunt resistances are sufficient to produce within said charging zone an average voltage gradient of less than about 25 kv/in.

7. In an electrostatic induction spray system including a spray nozzle having liquid discharge ports, electrode means spaced around said nozzle to define a charging zone surrounding said spray discharge ports, and a power supply having a voltage source for applying a DC voltage between said electrodes and said liquid within said charging zone to provide an electrostatic field having a voltage gradient sufficient to induce on liquid spray particles ejected from said liquid discharge ports an electrostatic charge, the improvement in said power supply comprising:

control impedance means connected between said voltage source and said electrode means, said control impedance means comprising a control resistance in effective series circuit relationship with the internal spacial impedance across said charging zone, the ohmic value of said control resistance with respect to said voltage gradient being sufficient to produce within said charging zone an average voltage gradient that will induce an electrostatic charge on said liquid spray particles, said voltage gradient being maintained at a level less than that required for corona discharge within said charging zone, and current flow to said electrode being so limited as to substantially eliminate sparking or dangerous shocks.

8. The system of claim 7, wherein the ohmic value of said control resistance is between about 1000 megohms and 50,000 megohms.

9. The system of claim 7, wherein said control impedance further includes a shunt resistance connected between said voltage source and ground potential, said shunt resistance having an ohmic value approximately equal to or less than the value of said control resistance.

* * * * *